United States Patent
Larson et al.

(10) Patent No.: US 11,558,956 B2
(45) Date of Patent: Jan. 17, 2023

(54) SYSTEMS AND METHODS FOR THERMAL CONTROL OF A GENERATOR CONTROL UNIT

(71) Applicant: Hamilton Sundstrand Corporation, Charlotte, NC (US)

(72) Inventors: Steven E. Larson, Inverness, IL (US); Eric A. Carter, Monroe, WI (US); Ethan Johnson, Byron, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 49 days.

(21) Appl. No.: 17/332,392

(22) Filed: May 27, 2021

(65) Prior Publication Data

US 2021/0378087 A1 Dec. 2, 2021

Related U.S. Application Data

(60) Provisional application No. 63/030,696, filed on May 27, 2020.

(51) Int. Cl.
*H01K 1/02* (2006.01)
*H05K 1/02* (2006.01)
*H05K 1/11* (2006.01)

(52) U.S. Cl.
CPC .......... *H05K 1/0203* (2013.01); *H05K 1/115* (2013.01); *H05K 2201/0129* (2013.01)

(58) Field of Classification Search
CPC ..... H05K 7/209; H05K 1/0203; H05K 1/0206
See application file for complete search history.

(56) References Cited

U.S. PATENT DOCUMENTS

| | | | |
|---|---|---|---|
| 4,535,385 A | 8/1985 | August et al. | |
| 5,812,375 A * | 9/1998 | Casperson | H05K 7/205 361/720 |
| 6,365,964 B1 * | 4/2002 | Koors | H05K 7/20436 257/713 |
| 6,821,816 B1 * | 11/2004 | Lawlyes | H01L 23/433 257/E23.09 |
| 7,651,245 B2 | 1/2010 | Thomas et al. | |
| 8,220,977 B2 | 7/2012 | Fugerer et al. | |
| 9,591,767 B2 | 3/2017 | Itoi et al. | |

(Continued)

FOREIGN PATENT DOCUMENTS

DE   102004030443 A1   1/2006
WO   2019146402 A1   8/2019

OTHER PUBLICATIONS

Extended European Search Report dated Jan. 12, 2022, issued during the prosecution of European Patent Application No. EP 21176045.9, 9 pages.

*Primary Examiner* — Sherman Ng
(74) *Attorney, Agent, or Firm* — Locke Lord LLP; Scott D. Wofsy; Alicia J. Carroll

(57) ABSTRACT

A generator control unit (GCU) having thermal control includes a GCU housing having a first side and a second side. A printed wiring board (PWB) is within the GCU housing between the first side and the second side. The PWB includes a component side that faces a first side of the GCU housing. At least one through via is positioned through a thickness of the PWB. At least one boss is positioned on the component side of the PWB. The at least one boss extends from a component of the PWB to the first side of the GCU housing.

19 Claims, 1 Drawing Sheet

(56) References Cited

U.S. PATENT DOCUMENTS

| | | |
|---|---|---|
| 10,398,021 B2 | 8/2019 | Avalos et al. |
| 2003/0227750 A1* | 12/2003 | Glovatsky .......... H05K 7/20454 |
| | | 361/699 |
| 2009/0251843 A1* | 10/2009 | Hironaka ............. H05K 9/0067 |
| | | 361/216 |
| 2013/0043572 A1 | 2/2013 | Williams et al. |
| 2016/0276566 A1* | 9/2016 | Pirk ....................... H05K 1/181 |
| 2018/0123014 A1* | 5/2018 | Zoller .................... H01L 35/06 |

* cited by examiner

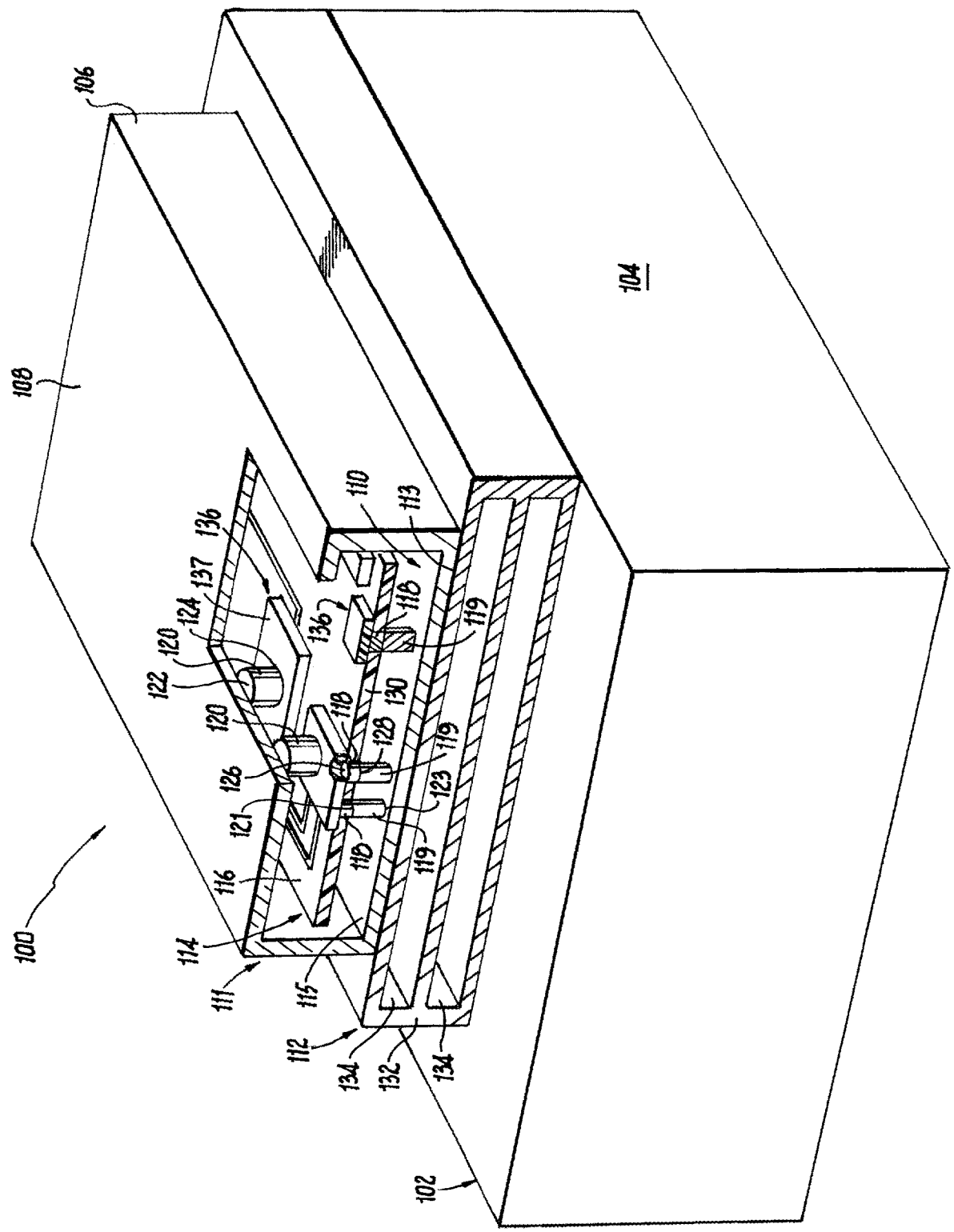

US 11,558,956 B2

SYSTEMS AND METHODS FOR THERMAL CONTROL OF A GENERATOR CONTROL UNIT

CROSS-REFERENCE TO RELATED APPLICATIONS

This application claims priority to and the benefit of U.S. Provisional Application No. 63/030,696, filed May 27, 2020, the entire contents of which are herein incorporated by reference in their entirety.

BACKGROUND

1. Field

The present disclosure relates to generator control units, specifically generator control units with a printed wiring board (PWB).

2. Description of Related Art

A generator control units (GCU) is typically remote from the generator housing for the generator which it controls. In some circumstances, it may be desired to position the GCU closer to the generator housing. Because generators generally dissipate heat through their generator housing, placing the GCU closer to its respective generator may cause overheating or other thermal issues. Moreover, space by the generator may be limited.

The conventional techniques have been considered satisfactory for their intended purpose. However, there is an ever present need for improved systems and methods which can be used to better control the thermal properties of the GCU in a compact and efficient manner. This disclosure provides a solution for this need.

SUMMARY

A generator control unit (GCU) having thermal control includes a GCU housing having a first side and a second side. A printed wiring board (PWB) is within the GCU housing between the first side and the second side. The PWB includes a component side that faces a first side of the GCU housing. At least one through via is positioned through a thickness of the PWB. At least one boss is positioned on the component side of the PWB. The at least one boss extends from a component of the PWB to the first side of the GCU housing.

In some embodiments, at least one through via includes copper. The at least one boss can include aluminum. The GCU housing can include aluminum. The at least one boss can include first and second end surfaces. The first end surface of the boss can abut the first side of the GCU housing and the second end surface of the boss can abut the component of the PWB. At least one of the boss or the through via can include at least one of a circular or square cross-section. The at least one through via can include a first end surface and a second end surface. The first end surface of the through via can be flush with the component side of the PWB and the second end surface of the through via is flush with a second side of the PWB.

In accordance with another aspect, a generator control assembly having thermal control includes a GCU housing having a first side and a second side, a heat shield mounted to the second side of the GCU housing. A PWB is within the GCU housing between the first side and the second side. The PWB includes a component side that faces a first side of the GCU housing. At least one through via is positioned through a thickness of the PWB. At least one boss is positioned on the component side of the PWB. The at least one boss extends from a component of the PWB to the first side of the GCU housing.

The heat shield can be mounted to an exterior surface of the second side of the GCU, opposite from the PWB across the second side of the GCU housing. The at least one boss and the at least one through via can be similar to those described above. The heat shield can include high temperature plastic walls with air pockets defined therein.

In accordance with another aspect, a generator assembly having thermal control includes a generator including a generator housing. A GCU housing is operatively connected to the generator housing. The GCU housing has a first side and a second side. A heat shield mounted to the first side of the GCU housing between the GCU housing and the generator housing. A printed wiring board (PWB) is within the GCU housing between the first side and the second side. The PWB includes a component side that faces a first side of the GCU housing. At least one through via is positioned through a thickness of the PWB. At least one boss is positioned on the component side of the PWB. The at least one boss extends from a component of the PWB to the first side of the GCU housing. The at least one boss and the at least one through via can be similar to those described above. The heat shield can be similar to the heat shield described above.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain FIGURES, wherein:

FIG. 1 is a partial cross-sectional schematic perspective view of a generator assembly constructed in accordance with embodiments of the present disclosure, showing a generator, a GCU housing, and a PWB.

DETAILED DESCRIPTION

Reference will now be made to the drawings wherein like reference numerals identify similar structural features or aspects of the subject disclosure. For purposes of explanation and illustration, and not limitation, an illustrative view of an embodiment of a generator assembly having thermal control is shown in FIG. 1 and is designated generally by reference character 100. Certain embodiments described herein can be used to provide a generator assembly with a generator control unit (GCU) having thermal controls that reduce the temperature of electronic components, e.g. electronic components on the printed wiring board (PWB) of the GCU.

As shown in FIG. 1, a generator assembly 100 having thermal control includes a generator 102 having a generator housing 104. A generator control unit (GCU) 111 includes a GCU housing 106 operatively connected to the generator housing 104. The GCU housing 106 includes aluminum or other suitable material. The GCU housing 106 has a first side 108 and a second side 110. A printed wiring board (PWB)

114 is within the GCU housing 106 between the first side 108 and the second side 110. A heat shield 112 is mounted to the second side 110 of the GCU housing 106 between the GCU housing 106 and the generator housing 104. The heat shield 112 is mounted to an exterior surface 113 of the second side 110 of the GCU, opposite from the PWB 114 across the second side 110 of the GCU housing 106. The heat shield 112 includes high temperature plastic walls 132 with air pockets 134 defined therein. The heat shield 112 is mounted to the GCU housing and/or the generator housing 104 with fasteners, e.g. screws, or the like.

With continued reference to FIG. 1, the PWB 114 includes a component side 116 that faces the first side 108 of the GCU housing 106. The PWB 114 includes a second side 130 that faces the second side 110 of the GCU housing 106. The component side 116 includes a variety of electrical components 136, which tend to produce heat during their normal function. For thermal control of the GCU, at least one through via 118 is positioned through a thickness of the PWB 114 and at least one boss 120 is positioned on the component side 116 of the PWB. The at least one boss 120 extends from a component 136 of the PWB 114 to the first side 108 of the GCU housing 106 to conduct and dissipate heat thereto. The addition of thermal vias 118 on the bottom side of electrical components 136 reduce critical component operating temperature by about 25.2° C. The addition of bosses 120 on the top side 137 of electrical components 136 reduce critical component operating temperature by about 8.4° C. This temperature reduction can result in improved component life.

As shown in FIG. 1, each boss 120 includes first and second end surfaces 122 and 124, respectively. The first end surface 122 abuts the first side 108 of the GCU housing 106 and wherein the second end surface 124 abuts the component 136 of the PWB 114. The at least one through via 118 includes copper. The at least one boss 120 includes aluminum. At least one of the boss or the through via 118 include at least one of a circular or square cross-section. The at least one through via 118 includes a first end surface 126 and a second end surface 128. The first end surface 126 of the through via 118 is flush with the component side 116 the PWB 114 and wherein the second end surface 128 of the through via 118 is flush with a second side 130 of the PWB 114. A stand-off 119 abuts the second end surface 128 of the through via 118 to thermally connect the through via 118 to the second side 110 of the GCU housing 106. The stand-off 119 has a first end surface 121 that abuts the second end surface 128 of the through via and the stand-off 119 has a second end surface 123 that abuts an inner surface 115 of second side 110 of the GCU housing 106. The stand-off 119 can be made from a variety of suitable metallic materials, such as aluminum, or the like. A given electrical component 136 can have one or more bosses 120, and/or one or more through vias 118 and stand-offs 119.

The methods and systems of the present disclosure, as described above and shown in the drawings, provide for improved thermal controls that reduce the temperature of electronic components, thereby increasing component life. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A generator control assembly having thermal control, the generator control assembly comprising:
   a generator control unit (GCU) housing having a first side and a second side;
   a printed wiring board (PWB) within the GCU housing between the first side and the second side, wherein the PWB includes a component side that faces a first side of the GCU housing;
   a heat shield mounted to an exterior surface of the second side of the GCU housing, opposite from the PWB across the second side of the GCU housing;
   at least one through via positioned through a thickness of the PWB; and
   at least one boss positioned on the component side of the PWB, wherein the at least one boss extends from a component of the PWB to the first side of the GCU housing.

2. The generator control assembly as recited in claim 1, wherein the at least one through via includes copper.

3. The generator control assembly as recited in claim 1, wherein the at least one boss includes aluminum.

4. The generator control assembly as recited in claim 1, wherein the GCU housing includes aluminum.

5. The generator control assembly as recited in claim 1, wherein the at least one boss includes first and second end surfaces, wherein the first end surface abuts the first side of the GCU housing and wherein the second end surface abuts the component of the PWB.

6. The generator control assembly as recited in claim 1, wherein at least one of the boss or the through via include at least one of a circular or square cross-section.

7. The generator control assembly as recited in claim 1, wherein the at least one through via includes a first end surface and a second end surface, wherein the first end surface is flush with the component side of the PWB and wherein the second end surface is flush with a second side of the PWB.

8. A generator control assembly having thermal control, the generator control assembly comprising:
   a GCU housing having a first side and a second side;
   a heat shield mounted to the second side of the GCU housing, wherein the heat shield includes high temperature plastic walls with air pockets defined therein;
   a printed wiring board (PWB) within the GCU housing between the first side and the second side, wherein the PWB includes a component side that faces a first side of the GCU housing;
   at least one through via positioned through a thickness of the PWB; and
   at least one boss positioned on the component side of the PWB, wherein the at least one boss extends from a component of the PWB to the first side of the GCU housing.

9. The generator control assembly as recited in claim 8, wherein the heat shield is mounted to an exterior surface of the second side of the GCU housing, opposite from the PWB across the second side of the GCU housing.

10. The generator control assembly as recited in claim 8, wherein the at least one boss includes first and second end surfaces, wherein the first end surface abuts the first side of the GCU housing and wherein the second end surface abuts the component of the PWB.

11. The generator control assembly as recited in claim 8, wherein the at least one through via includes a first end surface and a second end surface, wherein the first end surface is flush with the component side of the PWB and wherein the second end surface is flush with a second side of the PWB.

12. The generator control assembly as recited in claim 8, wherein the at least one through via includes copper.

13. The generator control assembly as recited in claim 8, wherein the at least one boss includes aluminum.

14. A generator assembly having thermal control, the generator assembly comprising:
- a generator including a generator housing;
- a GCU housing operatively connected to the generator housing, the GCU housing having a first side and a second side;
- a heat shield mounted to the second side of the GCU housing between the GCU housing and the generator housing;
- a printed wiring board (PWB) within the GCU housing between the first side and the second side, wherein the PWB includes a component side that faces a first side of the GCU housing;
- at least one through via positioned through a thickness of the PWB; and
- at least one boss positioned on the component side of the PWB, wherein the at least one boss extends from a component of the PWB to the first side of the GCU housing.

15. The generator assembly as recited in claim 14, wherein the heat shield is mounted to an exterior surface of the second side of the GCU housing, opposite from the PWB across the second side of the GCU housing.

16. The generator assembly as recited in claim 14, wherein the at least one boss includes first and second end surfaces, wherein the first end surface abuts the first side of the GCU housing and wherein the second end surface abuts a component of the PWB.

17. The generator assembly as recited in claim 14, wherein the at least one through via includes a first end surface and a second end surface, wherein the first end surface is flush with the component side of the PWB and wherein the second end surface is flush with a second side of the PWB.

18. The generator assembly as recited in claim 14, wherein the heat shield includes high temperature plastic walls with air pockets defined therein.

19. The generator assembly as recited in claim 14, wherein the at least one through via includes copper.

* * * * *